United States Patent
Chen et al.

(10) Patent No.: US 6,326,220 B1
(45) Date of Patent: Dec. 4, 2001

(54) METHOD FOR DETERMINING NEAR-SURFACE DOPING CONCENTRATION

(75) Inventors: Wei-Wen Chen, Hsinchu; Yaw-Lin Hwang, Taipei; Yun-Chi Yang, Hsinchu Hsien, all of (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/710,449

(22) Filed: Nov. 11, 2000

(51) Int. Cl.[7] .................................................. H01L 21/66
(52) U.S. Cl. .............................................. 438/14; 324/751
(58) Field of Search ................................ 438/14, 16, 17; 324/751, 752, 760

(56) References Cited

U.S. PATENT DOCUMENTS

| | | | |
|---|---|---|---|
| 3,850,508 | * 11/1974 | Sittig et al. ........................... | 356/209 |
| 5,216,362 | * 6/1993 | Verkuil .................................. | 324/158 |
| 5,581,194 | * 12/1996 | Lowell .................................. | 324/752 |
| 6,166,354 | * 12/2000 | Hause et al. ......................... | 219/390 |

* cited by examiner

Primary Examiner—David Nelms
Assistant Examiner—Quoc Hoang
(74) Attorney, Agent, or Firm—Baker Botts LLP

(57) ABSTRACT

A method for determining near-surface doping concentration is provided by utilizing surface photovoltage. A monochromatic light pulse is applied to a semiconductor substrate. When the energy of the incident light is larger than the energy gap of the semiconductor substrate, the light is absorbed by the substrate and thereby generates enough charge carriers. The carriers diffuse to the surface of the substrate and result in lowering the surface barrier, and hence, cause a shift of the surface voltage. The difference of the surface voltages, before and after the light pulse applied, is measured by using a surface photovoltage probe. Then, the doping concentration near the surface of the substrate can be determined according to the difference of the surface voltage.

21 Claims, 3 Drawing Sheets

METHOD FOR DETERMINING NEAR-SURFACE DOPING CONCENTRATION

FIELD OF THE INVENTION

The present invention relates to a method for determining doping concentration, and more particularly to a method for measuring near surface doping concentration by surface photovoltage (SPV).

BACKGROUND OF THE INVENTION

There are numerous individual operations, or processing steps, performed, in a strictly followed sequence, on the silicon wafer in the course of manufacturing a complex integrated circuit (IC). Each such operation must be precisely controlled in order to assure that the entire fabrication process yields integrated circuits displaying the required electrical characteristics.

Frequently, failure of an individual operation is detected only after the completion of the entire, very expensive, process of IC fabrication. Due to the very high cost of advanced IC fabrication processes, such failures result in the severe financial losses to the integrated circuit manufacturer. Therefore, detection of errors in the manufacturing process, immediately after their occurrence, could prevent the unnecessary continuation of the fabrication of devices which are destined to malfunction, and hence, could substantially reduce the financial losses resulting from such errors.

Process monitoring in semiconductor device manufacturing relies upon the examination of the changes which accruing certain physical or chemical properties of the silicon wafer upon which the semiconductor devices are fabricated. These changes may occur following the various processing steps to which the silicon wafer is subjected and are reflected by changes in the electrical properties of the wafer. Therefore, by monitoring selected electrical properties of the silicon wafer in the course of IC fabrication, an effective control over the manufacturing process can be accomplished.

Not all of the electrical characteristics of a completed integrated circuit can be predicted based on the measurements performed on a partially processed wafer. Most of the characteristics however, can be predicted directly or indirectly based on the investigation of the condition of the surface of the silicon wafer (substrate) in the course of IC manufacture. The condition of the silicon surface is very sensitive to the outcome of the individual processing steps, which are applied during IC manufacturing, and hence, the measurement of the electrical properties of the substrate surface can be an effective tool by which the monitoring of the outcome of the individual processing steps can be accomplished.

For metal-oxide-semiconductor (MOS) transistor, generally used in integrated circuits, the doping concentration of each doping region, such as source/drain region, directly effects the electrically characteristics of the transistor, so the doping concentration must be monitored after each processing step to predict the electrical properties of the transistor. However, the depth of the doping region trends to be shallow for gradually growing of the fabricating density of the IC manufactures, and hence, the energy of ion implanting for fabricating the doping regions is getting lower and results in difficulty to detect the doping concentration.

There are two methods for measuring the doping concentration in the prior art, secondary ion mass spectroscopy (SIMS) and spreading resistance profile (SRP). But, both methods are destructive measurement and required more times to prepare the test sample. It is hard to make sense when we want to monitor the production daily.

SUMMARY OF THE INVENTION

The present invention provides a method for determining near-surface doping concentration. The method is a non-destructive measurement, and can measure the near-surface doping concentration made by low energy implantation.

The present invention provides a method of measuring near-surface doping concentration. A substrate doped with a dopant is provided, and there is a first surface voltage on the surface of the substrate. A monochromatic light pulse is applied to the substrate to produce a second surface voltage on the surface of the substrate. The first and second surface voltages are measured by using a surface photovoltage probe, and then the doping concentration can be determined according to the difference of the first and second surface voltages.

DETAILED DESCRIPTIONS OF THE INVENTION

The present invention discloses a method for determining near-surface doping concentration. The method is a non-destructive measurement and easy to operate. A basic principle of the invention is discussed first to detail describe the present invention.

Figure 1:
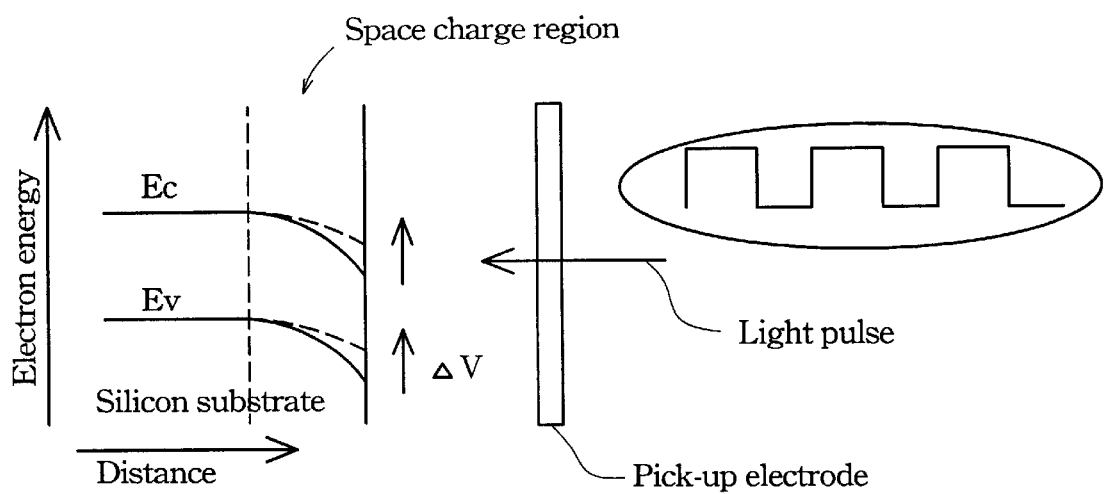
FIG. 1 shows a schematic view of a basic principle of measuring a near-surface doping concentration by using a surface photovoltage probe according to the present invention.

A substrate is provided. The substrate comprises a semiconductor substrate. For example, a substrate made of silicon is used in the embodiment of the invention, but not limited in silicon substrate. Referring to FIG. 1, in the lift side of FIG. 1 is a silicon substrate (a wafer). The horizontal axis is distance, and the vertical axis is electron energy, as shown in FIG. 1. The valence band energy (Ev) and conduction band energy (Ec) of the bulk of the silicon substrate are predetermined. Ev and Ec will decrease in the near surface and surface of the substrate, i.e. the space charge region as shown in FIG. 1.

A monochromatic light pulse, such as a laser light pulse, is applied to the substrate. While the energy of the monochromatic light pulse is larger than the energy gap of the substrate, valence electrons will be emitted by the light pulse and thereby form free electron-hole pairs. The positive charge carriers will move the surface and near surface of the substrate, and hence, form the space charge region. When the charges accumulated enough in the surface and near surface region of the substrate, a surface voltage in the surface of the substrate can be measured by using a capacitive pick-up electrode. The surface voltage is measured, before and after the light pulse is applied to the substrate. The surface voltage signal is amplified by using suitable amplifier, so a voltage difference $\Delta V$ can be measured. The voltage difference $\Delta V$ formed from applying light pulse is called surface photovoltage (SPV). When the substrate is doped with a dopant, different doping concentration will cause different SPV. Hence, we can determine the doping concentration in the surface and near surface region of the substrate by measuring the SPV.

Figure 2:
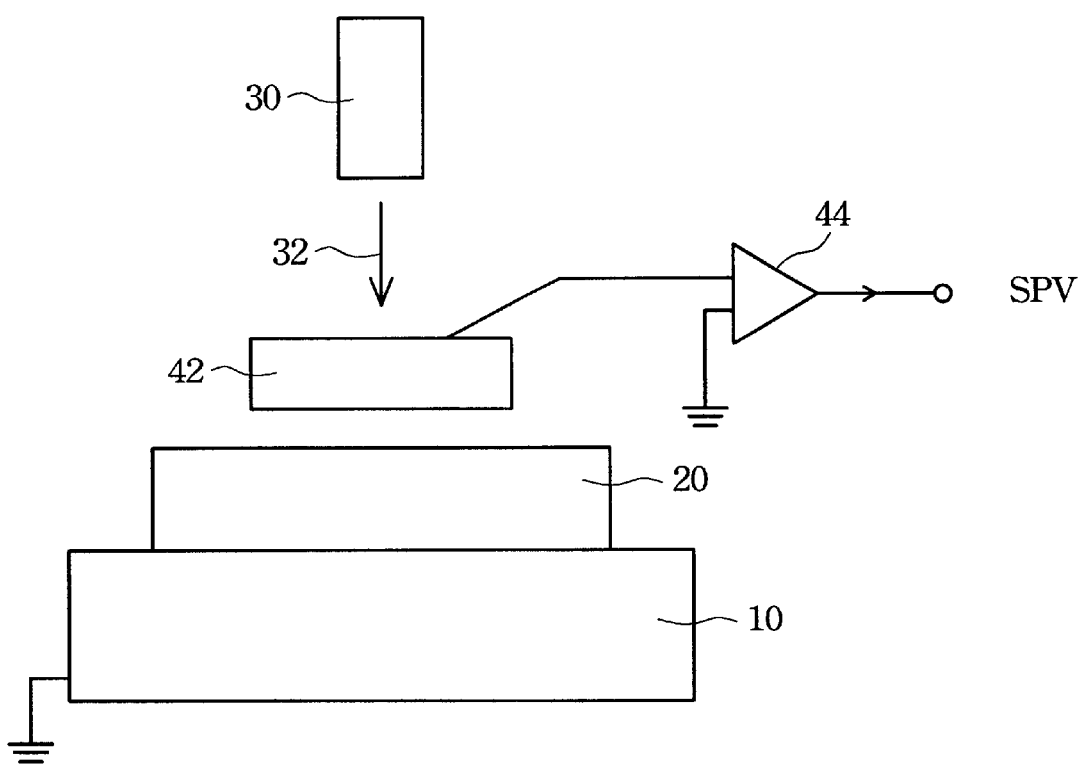
FIG. 2 shows a schematic view of the preferred embodiment of the present invention.

Referring to FIG. 2, it is a schematic view of the preferred embodiment of the present invention. A substrate 20 is fixed on a vacuum chuck 10. The substrate 20 includes a semiconductor substrate, such as silicon substrate.

There is a SPV probe is set to detect a surface voltage of the substrate 20. The SPV probe includes a capacitive pick-up electrode 42 over the substrate 20. The electrode 42 is made of transparent conductive materials, such as indium-tin oxide, and does not contact to the substrate 20. The electrode 42 is used to measure SPV in the surface and near surface of the substrate 20. The pick-up electrode 42 through a voltmeter 44, functioned like an amplifier, is connected to SPV processor, such as a computer, to enlarge the SPV signals measured by the electrode 42, and process the signals to determine the doping concentration in the surface and near surface of the substrate 20.

A monochromatic light pulse projector 30 is set over the pick-up electrode 42. The light projector 30 can project a monochromatic light pulse 32, a high coherent laser light pulse is preferred. For example, the light projector 30 can be semiconductor light-emitting diodes (LED) to form the desired laser light pulse. The light pulse 32 is formed from the projector 30 and applied to the substrate 20 through the transparent electrode 42 to produce SPV. Since the light pulse 32 only can produce SPV, it will not cause destruction to the structure of the semiconductor device in the surface of the substrate. Therefore, the method according to the present invention is a non-destructive measurement and easy to monitor production.

Figure 3:
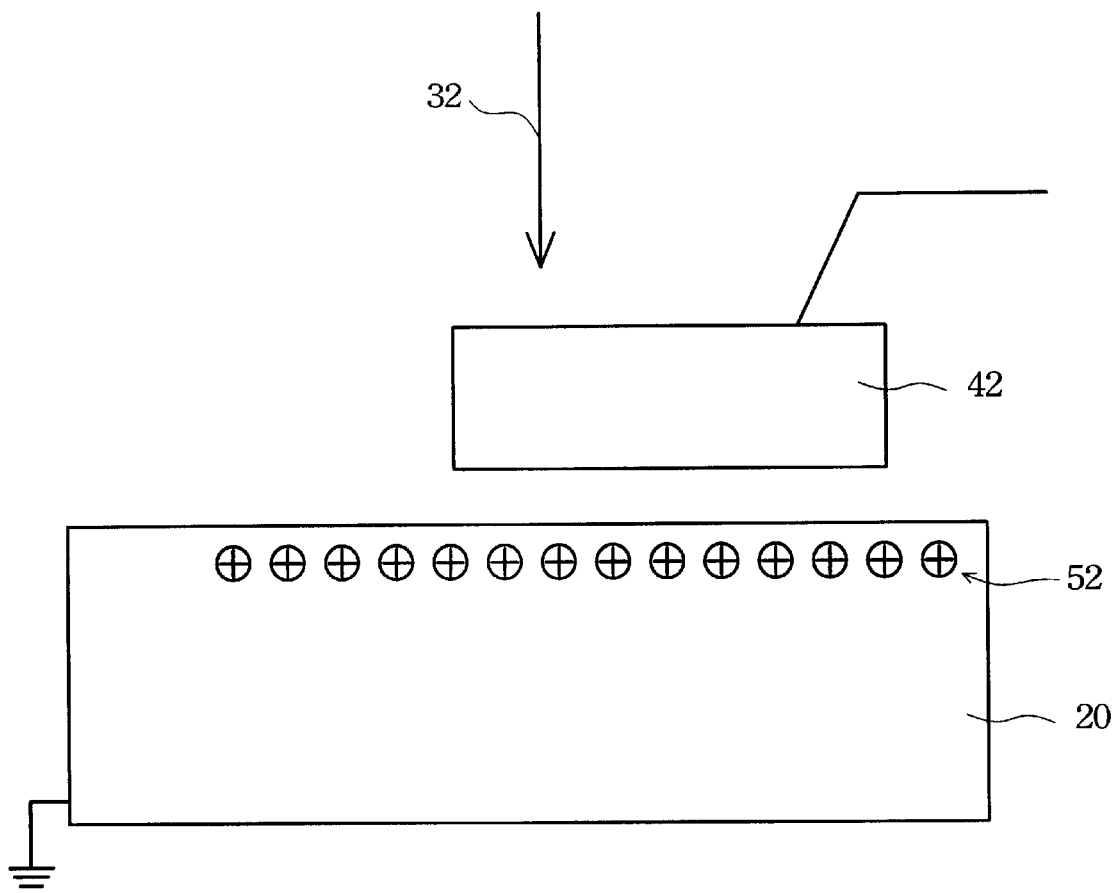
FIG. 3 shows charge carriers are generated while the light pulse is absorbed by the substrate.

The operation steps of the invention are then briefly described hereafter. First, a substrate 20, such as a silicon substrate, is provided. There is at least a doping region in the substrate 20. The doping region is doped with a dopant, such as boron (B) or phosphorus (P), etc. The doping region is formed by such as ion implantation, wherein the implantation is performed in an ultra low energy, such as 0.1–10 keV. The substrate 20 doped with the dopant now has a first surface voltage measured by using a capacitive pick-up electrode 42. A monochromatic light pulse 32 is applied to the substrate 20 for a predetermined time. The projected light pulse 32 is absorbed by the substrate 20 and then emits to produce electron-hole pairs. The positive charge carriers will move to the surface and near surface of the substrate 20, i.e. the space charge region, and accumulate here, as shown in FIG. 3, to produce a second surface voltage. The second surface voltage is then measured by using the capacitive pick-up electrode 42. The difference of the first and second surface voltages (i.e. SPV) is calculated, and then we can reversely compute the doping concentration according to a beforehand experimental data with fixed doping concentration.

According to the above description, the present invention provides a method for determining near-surface doping concentration. The method is performed by monochromatic light pulse to produce SPV, and then SPV is measured to calculate the doping concentration of the near surface of the substrate. The method of the present invention is non-destructive measurement. The present invention can measure ultra low energy implantation and is easy to monitor production daily.

While the preferred embodiment of the invention has been illustrated and described, it will be appreciated that various changes can be made therein without departing from the spirit and scope of the invention.

What is claimed is:

1. A method of measuring near-surface doping concentration, comprising the step of:
    providing a substrate doped with a dopant, and there is a first surface voltage on the surface of the substrate;
    applying a monochromatic light pulse to the substrate to produce a second surface voltage on the surface of the substrate; and
    measuring the first and second surface voltages by using a surface photovoltage probe and determining the doping concentration according to the difference of the first and second surface voltages.

2. The method according to claim 1, wherein the substrate comprises a semiconductor substrate.

3. The method according to claim 2, wherein the semiconductor substrate comprises a silicon substrate.

4. The method according to claim 1, wherein a method of doping the dopant into the substrate comprises ion implantation.

5. The method according to claim 4, wherein the implanting energy is about 0.1–10 keV.

6. The method according to claim 1, wherein the dopant comprises boron.

7. The method according to claim 1, wherein the dopant comprises phosphorus.

8. The method according to claim 1, wherein the monochromatic light pulse is made from laser light.

9. The method according to claim 1, wherein the energy of the monochromatic light pulse is larger than an energy gap of the substrate.

10. The method according to claim 1, wherein the surface photovoltage probe at least comprises a surface voltage sensor.

11. The method according to claim 10, wherein the surface voltage sensor at least comprises a pick-up electrode.

12. The method according to claim 11, wherein the pick-up electrode is made of indium-tin oxide.

13. The method according to claim 1 wherein the determining of the doping concentration includes comparing the difference with predetermined differences of known dopant concentrations.

14. A method of measuring near-surface doping concentration, comprising the step of:
    providing a semiconductor substrate doped with a dopant, and there is a first surface voltage on the surface of the substrate;
    applying a laser light pulse to the substrate to produce a second surface voltage on the surface of the substrate; and
    measuring the first and second surface voltages by using a surface photovoltage probe and determining the doping concentration according to the difference of the first and second surface voltages.

15. The method according to claim 14, wherein a method of doping the dopant into the substrate comprises ion implantation.

16. The method according to claim 15, wherein the implanting energy is about 0.1–10 keV.

17. The method according to claim 14, wherein the laser light pulse is made from a semiconductor light-emitting diodes.

18. The method according to claim 14, wherein the energy of the laser light pulse is larger than an energy gap of the semiconductor substrate.

19. The method according to claim 14, wherein the surface photovoltage probe at least comprises a pick-up electrode.

20. The method according to claim 19, wherein the pick-up electrode is made of indium-tin oxide.

21. A method of measuring near-surface doping concentration, comprising:

provi ding a semiconductor substrate doped with a dopant, and there is a first surface voltage on the surface of the substrate, wherein the dopant is doped by an implanting energy of about 0.1 keV to 10 keV;

applying a laser light pulse to the substrate to produce a second surface voltage on the surface of the substrate, wherein the energy of the laser light pulse is larger then an energy gap of the semiconductor substrate; and measuring the first and second surface voltages by using a surface photovoltage probe having an indium-tin oxide pick-up electrode and determining the doping concentration only according to the difference of the first and second surface voltages.

* * * * *